United States Patent [19]

Frisbie et al.

[11] 3,945,505
[45] Mar. 23, 1976

[54] INDEXING APPARATUS

[75] Inventors: Milo W. Frisbie; Milton R. McKinley, both of Mesa, Ariz.

[73] Assignee: Motorola, Inc., Chicago, Ill.

[22] Filed: July 8, 1974

[21] Appl. No.: 486,273

[52] U.S. Cl.............. 214/1 BB; 74/436; 198/20 T; 198/37
[51] Int. Cl.² ........................................ B65G 47/57
[58] Field of Search.................. 214/1 R, 1 BB, 89; 198/20 T, 21, 37, 75; 74/84 R, 436

[56] References Cited
UNITED STATES PATENTS

| | | | |
|---|---|---|---|
| 2,307,886 | 1/1943 | Hansson.............................. | 74/436 |
| 3,268,055 | 8/1966 | Stein ................................... | 198/21 |
| 3,516,386 | 6/1970 | Landwehr..................... | 214/1 BC X |

*Primary Examiner*—Robert J. Spar
*Assistant Examiner*—George F. Abraham
*Attorney, Agent, or Firm*—Willis E. Higgins; Harry M. Weiss

[57] ABSTRACT

Apparatus for successively indexing slots of a wafer carrier into position at an end of a conveying means, such as an air slide, utilizes motion of a rotary drive means to move pins within drive slots and impart motion to the carrier. As the rotary drive head rotates, a pin moves down into a drive slot, pushes against a sidewall of the slot to move the carrier, then retracts back to the end of the slot. With proper positioning of the rotary drive means, the pins also serve to prevent extraneous motion of the carrier when the drive means is not rotating. This apparatus has negligible starting torque when rotation of the drive means begins, and has smooth acceleration and deceleration of the carrier as its motion stops and starts.

5 Claims, 4 Drawing Figures

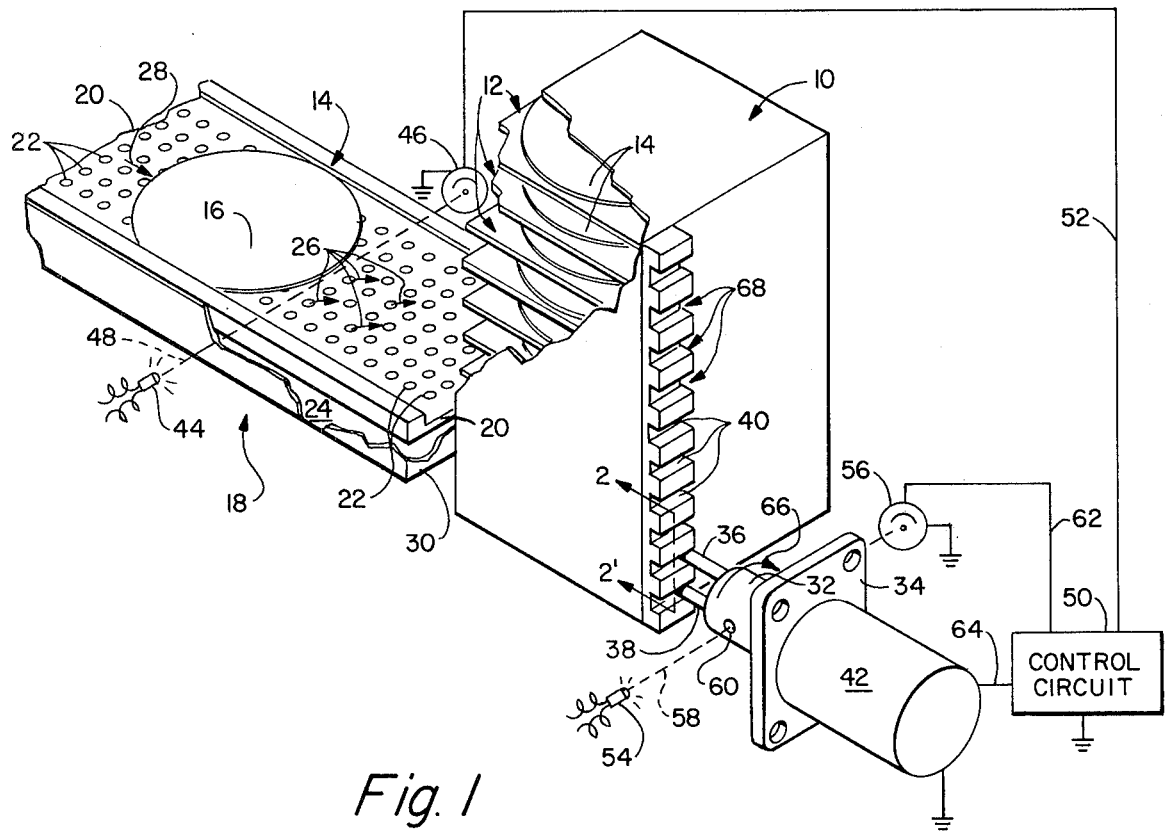
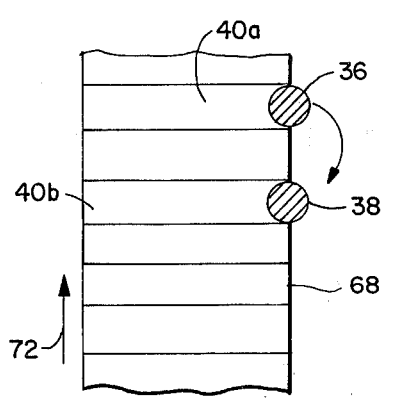
Fig. 2a
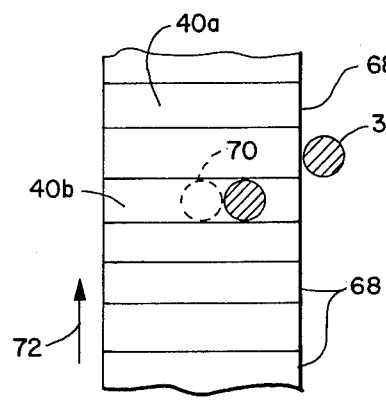
Fig. 2b
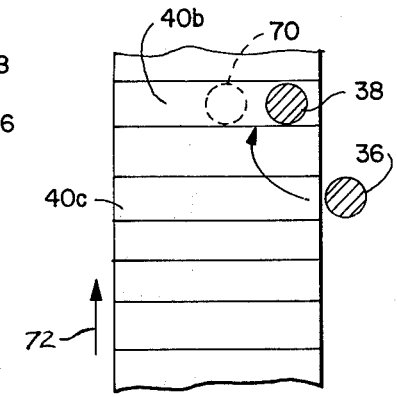
Fig. 2c

INDEXING APPARATUS

FIELD OF THE INVENTION

This invention pertains to an indexing apparatus for successively positioning slots in a wafer carrier at the end of a conveying means. More particularly, the invention relates to indexing apparatus for this purpose of simplified construction which will position these slots efficiently, reliably, and precisely without requiring sophisticated controls for the indexing apparatus.

DESCRIPTION OF THE PRIOR ART

The manufacture of integrated circuits or discrete semiconductor devices in semiconductor wafers is a highly sophisticated, labor intensive operation. As manufacturing volumes have increased and the manufacturing techniques employed have become more sophisticated, an era of automated wafer handling has begun to develop. A technique that is achieving wide acceptance for transporting the semiconductor wafers from process operation to process operation involves use of so called "air slides", in which the wafers move along a track while suspended on air jets.

For many process operations, it is necessary to load the semiconductor wafers into wafer boats or other carriers which are arranged to hold the wafers in spaced, parallel relationship to each other in slots. For the loading operation, it is further known to index a wafer boat or other carrier successively at the end of the air slide or other conveyer in order to load wafers from the end of the air slide into the carrier, or to remove the wafers successively from the carrier onto the air slide. Conventionally, the indexing motion is imparted to the carrier by a gear which interacts with teeth on the carrier. While this approach for carrying out the indexing has been reasonably successful, there are some problems with it. When an indexing motion starts, a high level of starting torque is present, which must be overcome by the motor used to drive the gear. Secondly, motion of the gear is transmitted in a linear relationship to motion of the carrier. This means that very precise control over the motor is required in order to position the carrier precisely as required for the indexing operation. Precisely controlling the stopping of a motor is made more difficult with increasing size of the motor. To overcome the starting torque, a substantially larger motor than would otherwise be required must be employed. Thus, in order to obtain full benefit from automated wafer handling, including loading and unloading from a carrier, a need remains for an indexing apparatus that meets the rather stringent requirements imposed by this particular environment.

SUMMARY OF THE INVENTION

Accordingly, it is an object of this invention to provide an indexing apparatus for wafer carriers which has a negligible starting torque when the carrier begins to move.

It is another object of the invention to provide an indexing apparatus for wafer carriers which has a smooth acceleration and deceleration when motion of the carrier starts and stops.

It is still another object of the invention to provide an indexing apparatus for wafer carriers in which precise control of an indexing motor is not required for accurate positioning of the carrier.

The attainment of these and related objects may be achieved through use of the indexing apparatus for wafer carriers herein disclosed. The apparatus successively indexes slot of a wafer carrier into position at an end of an air slide or other conveying means. The wafer carriers to be indexed each have a plurality of drive slots arranged along them, the slots having sides, and an end. A support member is positioned on the apparatus proximate to where the drive slots pass through the apparatus. A rotary drive member is mounted on the support member near to where the end of the drive slots passes through the apparatus. The rotary drive member has a plurality of pins adapted to engage the drive slot as the drive head rotates. A pin engages a slot at a point proximate to the end of the drive slot, then moves down into the slot as the drive head rotates, provides a force against a wall of the slot perpendicular to the slot against the carrier, then moves back near the end of the slot as the rotary drive member continues to rotate. As the pin first begins to move into the slot, it exerts little or no force perpendicular to the slot. This means that there is little or no starting torque for the motor which rotates the drive member. As the pin moves further and further into the slot and nears the extent of its path of travel within the slot, the amount of force applied perpendicular to the slot increases, until the component of force is virtually all perpendicular to the slot for driving the carrier forward. This means that acceleration of the carrier is smooth. Then, as the pin begins moving toward the end of the slot, the perpendicular force against the slot decreases. Should the drive motor not be stopped precisely as the pin reaches the end of the slot, since little or no force is being applied perpendicular to the slot at that time, failure to stop the drive motor precisely does not result in improper positioning of the carrier. With an indexing apparatus operating in accordance with this invention, it is therefore possible to use both a smaller drive motor and less sophisticated control circuitry for the motor than is required with a conventional gear driven indexing apparatus. The attainment of the foregoing and related objects, advantages, and features of the invention should be apparent after review of the following detailed description of the invention, taken in conjunction with the drawings.

BRIEF DESCRIPTION OF THE DRAWINGS

In the Drawings:

FIG. 1 represents a perspective in partial cross section and partial schematic form showing an apparatus in accordance with the invention;

FIGS. 2A–2C are enlarged cross sections taken along the line 2—2 in FIG. 1, showing how the invention operates.

DETAILED DESCRIPTION OF THE INVENTION

Turning now to the drawings, more particularly FIG. 1, an apparatus for indexing a wafer carrier 10 is shown. The wafer carrier 10 has a plurality of wafer slots 12 into each of which a semiconductor wafer 14 is to be loaded. The semiconductor wafer 14 has a top surface 16 in which integrated circuits or other semiconductor devices are formed, and which is liable to damage by contact. Consequently, wafers 14 are moved to the wafer carrier 10 by means of air slide 18, which moves them without physical contact. The air slide 18 has top plate 20 with a large number of air holes 22 through it. Manifold 24 of the air slide receives air under pressure, which is expelled through openings 22 in the form of air jets 26. The air jets 26 serve to suspend semiconductor wafer 14 above top 20 of the air slide 18, as well as to propel it in the direction indicated by arrow 28. Wafer carrier 10 is positioned at end 30 of air slide 18, preferably at a slight angle from the vertical away from the air slide 30, to aid retention of the wafers 14 loaded into the slots 12. As a semiconductor wafer 14 is loaded into wafer carrier 10, it is necessary to index the carrier upwards to present another slot 12 in loading position. Obviously, this indexing operation must be carried out reliably and reproducibly in order to prevent damage to the semiconductor wafers 14, jamming of the apparatus and the like.

The indexing apparatus has a rotary drive member 32 rotatively mounted on support 34, such as by means of a ball bearing assembly (not shown). The rotary drive member has first and second pins 36 and 38, which fit into indexing slots 40 of carrier 10, as best shown by considering FIG. 1 and FIGS. 2A–2C together. Rotary drive member 32 is connected to indexing motor 42.

In order to allow automatic operation of the indexing apparatus herein, a light source 44 and a photocell 46 are positioned near end 30 of air slide 18 so that the path of light beam 48 is intercepted by a semiconductor wafer 14 approaching end 30 of air slide 18. Photocell 46 is connected to control circuit 50 for indexing motor 42 by line 52. Light source 44 and photocell 46 are utilized to initiate an indexing cycle.

A second light source 54 and photocell 56 are positioned so that light beam 58 from light source 54 will pass through aperture 60 in rotary drive member 32 to photocell 56 each half rotation of rotary drive member 32. Photocell 56 is connected to control circuit 50 by line 62. Control circuit 50 is connected to indexing motor 42 by line 64. Light source 54 and photocell 56 are used to terminate an indexing cycle.

With particular reference to FIGS. 2A–2C, the operation of the indexing apparatus of this invention will now be explained. When semiconductor wafer 14 interrupts light beam 48 from light source 44, the resulting change in signal from photocell 46 on line 52 is fed to indexing motor control circuit 50. After a suitable delay to allow the wafer 14 to enter the wafer slot 12 of carrier 10 which is in wafer receiving position at end 30 of air slide 18, control circuit 50 supplies a suitable signal on line 64 to start indexing motor 42. Indexing motor 42 rotates rotary drive member 32 in the direction indicated by arrow 66. Rotary drive member 32 is positioned with its axis of rotation coextensive with ends 68 (see FIGS. 2A and 2B) of drive slots 40. At the beginning of a rotation cycle, first and second pins 36 and 38 of rotary drive member 32 are in the position shown in FIG. 2A. With the pins 36 and 38 in the position shown, wafer carrier 10 is restrained from moving in either direction.

Rotation of the rotary drive member 32 causes drive pin 36 to move out of first drive slot 40A shown in FIG. 2A, and it causes second drive pin 38 to move into second drive slot 40B as shown in FIG. 2B. The initial motion of drive pin 38 is essentially completely along slot 40B toward position 70. As the drive pin 38 moves closer to the position 70 in slot 40B, it begins to exert a vertical force against drive slot 40B in the direction indicated by arrow 72. When pin 38 has traveled in slot 40B over to position 70 in the course of its rotation, substantially all of the force exerted by it against slot 40B is in the direction indicated by arrow 72. As more and more of the force exerted by pin 38 is in the direction shown by arrow 72, wafer carrier 10 moves in the direction of arrow 72 with a steadily increasing velocity.

As a consequence of this motion, slot 40B of the wafer carrier 10 moves to the position shown in FIG. 2C. As rotation of rotary drive member 32 continues, drive pin 38 begins to withdraw from slot 40B, as shown in FIG. 2C. As pin 38 withdraws during its rotation, the force applied by it against slot 40B decreases, and the motion of wafer carrier 10 in the direction of arrow 72 correspondingly decreases. As the indexing cycle completes, pin 36 enters slot 40C and the pins 36 and 38 assume a corresponding position in slots 40B and 40C, respectively, to their positions in slots 40A and 40B shown in FIG. 2A, and the indexing apparatus is ready for another cycle. It thus can be seen that wafer carrier 10 moves upward one slot for each half rotation of rotary drive member 32.

As pin 36 enters top 68 of slot 40C, aperture 60 through rotary drive member 32 rotates into proper position so that light beam 58 from light source 54 strikes photocell 56. Photocell 56 provides an output on line 62 to control circuit 50, which in turn provides a suitable signal on line 64 to indexing motor 42 to stop it. In like manner, a succeeding indexing cycle is initiated by interruption of light beam 48 passing from light source 44 to photo detector 46 by another semiconductor wafer 14.

It should now be apparent that an indexing apparatus for a wafer carrier capable of accomplishing the stated objects of the invention has been provided. Because substantially no force is applied against wafer carrier 10 at the time the indexing apparatus begins rotation, there is negligible starting torque at the beginning of rotation of the apparatus. As rotation of the apparatus continues, the apparatus applies more and more force to the wafer carrier, thus accelerating its indexing motion. The force reaches a maximum, then decelerates in a corresponding manner, with little or no force applied against wafer carrier 10 as the indexing cycle is completed. Because little or no force is applied at the beginning and end of an indexing cycle, precise control over the stopping of indexing motor 42 is not required to provide precision indexing of the wafer slots 12 in wafer carrier 10.

While the invention has been particularly shown and described in reference to a preferred embodiment thereof, it will be understood by those skilled in the art that changes in form and details may be made therein without departing from the spirit and scope of the invention. For example, a greater number of pins on the rotary drive member 32 than the two shown in the embodiment can be employed, although it is not desirable to have a large number of pins on the rotary head, since the operation begins to approximate that of a gear driven indexing apparatus as the number of pins is increased. Further, in the embodiment shown, the axis of rotation of the rotary drive head 32 is perpendicular to the plane of motion of the wafer carrier 10. This axis of rotation could equally well be parallel to the plane of motion of the wafer carrier 10.

What is claimed is:

1. An apparatus for successively indexing slots of a wafer carrier into position at an end of a conveying means, comprising:

a. a plurality of drive slots arranged along the carrier to be indexed, said slots having sides and an end, b. a support member positioned proximate to said drive slots, c. a rotary drive member mounted on said support member proximate to the end of the drive slots on said carrier, said rotary drive member having a plurality of pins adapted to engage the drive slots as said drive head rotates, beginning at a point proximate to the end of the drive slots, move into the slots, provide a force perpendicular to said slots against said carrier, then move back toward the point proximate to the end of the slots, d. means responsive to motion of a wafer with respect to the wafer carrier, for initiating an index cycle, and e. means, responsive to rotation of said drive member one indexing position, for terminating an index cycle.

2. The apparatus of claim 1 in which said rotary drive means has two pins adopted to engage the drive slots.

3. The apparatus of claim 2 in which said means for terminating an index cycle comprises:
 1. a photocell mounted on one side of said rotary drive member.
 2. a light source directed at said photocell and positioned on the other side of the rotary drive member from said photocell,
 3. an aperture through said rotary drive member arranged to selectively allow light to pass between said light source and said photocell each half rotation of said rotary drive member and
 4. control means operatively connecting said photocell and said rotary drive means.

4. The apparatus of claim 1 in which the axis of rotation of said rotary drive member is in the plane of motion of the wafer carrier.

5. The apparatus of claim 1 in which the axis of rotation of said rotary drive member is perpendicular to the plane of motion of the wafer carrier.

* * * * *